United States Patent
Park et al.

(10) Patent No.: US 7,719,274 B2
(45) Date of Patent: May 18, 2010

(54) METHOD OF OBTAINING A MAGNETIC RESONANCE IMAGE IN WHICH THE STREAK ARTIFACTS ARE CORRECTED USING NON-LINEAR PHASE CORRECTION

(75) Inventors: Hyun Wook Park, Daejeon (KR); Jun-Young Chung, Incheon (KR)

(73) Assignee: Korea Advanced Institute of Science & Technology, Yuseong-Gu (KR)

( * ) Notice: Subject to any disclaimer, the term of this patent is extended or adjusted under 35 U.S.C. 154(b) by 52 days.

(21) Appl. No.: 11/625,132

(22) Filed: Jan. 19, 2007

(65) Prior Publication Data

US 2010/0085049 A1 Apr. 8, 2010

(30) Foreign Application Priority Data

Dec. 21, 2006 (KR) .................. 10-2006-0131596

(51) Int. Cl.
*G01V 3/00* (2006.01)
(52) U.S. Cl. .................. 324/309; 324/307; 324/314; 324/318
(58) Field of Classification Search ......... 324/300–322; 600/407–435; 382/128–131
See application file for complete search history.

(56) References Cited

U.S. PATENT DOCUMENTS

| | | | | | |
|---|---|---|---|---|---|
| 4,509,015 | A | * | 4/1985 | Ordidge et al. | 324/309 |
| 4,684,891 | A | * | 8/1987 | Feinberg | 324/309 |
| 5,138,259 | A | * | 8/1992 | Schmitt et al. | 324/309 |
| 5,621,321 | A | * | 4/1997 | Liu et al. | 324/309 |
| 5,647,362 | A | * | 7/1997 | Fuderer et al. | 600/410 |
| 5,742,163 | A | * | 4/1998 | Liu et al. | 324/309 |
| 5,825,185 | A | * | 10/1998 | Liu et al. | 324/309 |
| 5,928,146 | A | * | 7/1999 | Itagaki et al. | 600/410 |
| 5,942,897 | A | * | 8/1999 | Kanazawa | 324/309 |
| 6,064,205 | A | * | 5/2000 | Zhou et al. | 324/309 |
| 6,259,250 | B1 | * | 7/2001 | Mock | 324/309 |
| 6,265,873 | B1 | * | 7/2001 | Le Roux | 324/309 |
| 6,275,037 | B1 | * | 8/2001 | Harvey et al. | 324/309 |
| 6,285,187 | B1 | * | 9/2001 | Mock | 324/309 |
| 6,320,377 | B1 | * | 11/2001 | Miyazaki et al. | 324/306 |
| 6,414,487 | B1 | * | 7/2002 | Anand et al. | 324/309 |
| 6,528,998 | B1 | * | 3/2003 | Zhou et al. | 324/309 |
| 6,529,001 | B2 | * | 3/2003 | Mock | 324/309 |
| 6,697,507 | B1 | * | 2/2004 | Chapman | 382/131 |
| 6,700,374 | B1 | * | 3/2004 | Wu et al. | 324/312 |
| 6,933,720 | B2 | * | 8/2005 | Zhang | 324/309 |
| 2001/0008376 | A1 | * | 7/2001 | Mock | 324/307 |

OTHER PUBLICATIONS

Robust EPI Phase Correction, "*In Proceedings of the Society of Magnetic Resonance in Medicine*," p. 2014, 1997.
Buonocore et al., "Ghost Artifact Reduction for Echo Planar Imaging Using Image Phase Correction," *Magn.Reson. Med.*, 38, pp. 89-100, 1997.
Hu et al., "Artifact Reduction in EPI with Phase-Encoded Reference Scan," *Magnetic Resonance in Medicine*, 36 pp. 166-171, 1996.

* cited by examiner

*Primary Examiner*—Brij B. Shrivastav
*Assistant Examiner*—Tiffany A Fetzner
(74) *Attorney, Agent, or Firm*—Foley Lardner LLP

(57) ABSTRACT

A non-linear phase correction method is provided. For the non-linear phase correction method, image information is acquired by gradient echo echo planar imaging (EPI). Reference information is acquired by spin echo EPI. The image information is corrected based on the reference information.

3 Claims, 5 Drawing Sheets

METHOD OF OBTAINING A MAGNETIC RESONANCE IMAGE IN WHICH THE STREAK ARTIFACTS ARE CORRECTED USING NON-LINEAR PHASE CORRECTION

This nonprovisional application claims priority under 35 U.S.C. §119(a) on Patent Application No. 10-2006-0131596 filed in Republic of Korea on Dec. 21, 2006, the entire contents of which are hereby incorporated by reference.

BACKGROUND

1. Field

This document relates to a phase correction method, and more particularly, to a non-linear phase correction method.

2. Related Art

Magnetic resonance imaging (MRI) is used to acquire an accurate image of interior parts of a human body. MRI is based on a field of physics in nuclear magnetic resonance (NMR). Nuclei including an odd number of neutrons or an odd number of protons usually have a net magnetic moment, and are NMR active.

Echo planar imaging (EPI), which is a high-speed MRI technique, is widely used in various fields including functional MRI (fMRI), diffusion tensor imaging (DTI), which is used to find out the position and direction of white matter fibrous tissues, cardiac function measuring imaging, diffusion-weighted imaging (DWI), and perfusion-weighted imaging.

EPI is generally classified into two types, a spin echo and gradient echo, depending on a method of obtaining an echo signal.

Typically, gradient echo EPI is used to acquire images related to fMRI and cardiac functions, while spin echo EPI is used to acquire images related to DTI, DWI, and PWI.

EPI needs to be used up to a critical value of hardware because of the fast signal acquisition. Also, since a signal is acquired by a shingle shot, EPI is sensitive to uniformity in a main magnetic field, variation in magnetic susceptibility, and chemical transition. Due to the above limitation and characteristics, various artifacts such as Nyquist ghost and geometric distortion may be produced in finally reconstructed images.

A correction method of removing artifacts inherent in high-speed EPI is commonly classified into a linear phase correction method and a non-linear phase correction method.

For a linear phase correction method, there is one widely applied approach that a phase is first found using a navigator echo signal, which is additionally acquired to use reference information suggested in an article by Heid O., entitled "Robust EPI Phase Correction," *In Proceedings of the Society of Magnetic Resonance in Medicine*, p. 2014, 1997, and an acquired signal is corrected based on a phase found from the first found phase. Another widely applied approach for the linear phase correction method includes reconstructing an image by drawing even and odd numbers of signals individually as suggested in an article by Buonocore M. H. and Gao L., entitled "Ghost Artifact Reduction for Echo Planar Imaging Using Image Phase Correction," *Magn. Reson. Med.*, 38, pp. 89-100, 1997, generating two-dimensional phase images, selecting one row of the images, and applying the selected row to all of the signals for the correction.

For a non-linear phase correction method, there is one approach that sampled points of signals acquired by EPI, which applies a phase gradient magnetic field, are individually corrected using a phase of an additional reference information signal acquired by EPI, which is removed of a phase gradient magnetic field. Such a non-linear phase correction method contains more information than the linear phase correction method, and thus, the non-linear phase correction method is considered effective to remove artifacts produced in high-speed EPI.

However, when the non-linear phase correction method is applied, in gradient echo EPI, numerous echo signals acquired from a certain sectional plane often have different levels of Dephasing due to variations in uniformity of a main magnetic field and magnetic susceptibility. The Dephasing of the echo signals may generate a streak artifact.

SUMMARY

An aspect of this document is to provide a method for correcting a cause of streak artifact.

In an aspect, a non-linear phase correction method comprises acquiring image information by gradient echo echo planar imaging (EPI), acquiring reference information by spin echo EPI, and correcting the image information based on the reference information.

The correction may be carried out by subtracting a phase value of the reference information from a phase value of the image information.

The subtraction may be carried out by converting a phase of the reference information into a negative value.

The image information may be acquired under that state that a phase-encoding gradient magnetic field is applied.

The reference information may be acquired under the state that the phase-encoding and the gradient magnetic field are not applied.

The phase value of the image information may be a phase of information obtained by performing one-dimensional Fourier transformation to the image information.

The phase value of the reference information may be a phase of information obtained by performing the one-dimensional Fourier transformation to the reference information and projecting the transformed reference information.

In another aspect, there is provided a computer readable recording medium on which a program for executing the non-linear phase correction method is recorded.

In a further another aspect, there is provided a magnetic resonance apparatus driving the non-linear phase correction method.

BRIEF DESCRIPTION OF THE DRAWINGS

The implementation of this document will be described in detail with reference to the following drawings in which like numerals refer to like elements.

DETAILED DESCRIPTION

Hereinafter, an implementation of this document will be described in detail with reference to the attached drawings.

A streak artifact was first reported by Xiaoping Hu and Tuong Huu Le, entitled "Artifact Reduction in EPI with Phase-Encoded Reference Scan," *Magnetic Resonance in Medicine*, 34, pp. 166-171, 1996. However, in this paper, it is briefly mentioned that an occurrence of streak artifact is associated with a signal-to-noise ratio (SNR), blood vessels, or a flow of cerebrospinal fluid.

1) Cause of Streak Artifact

Figure 1A:
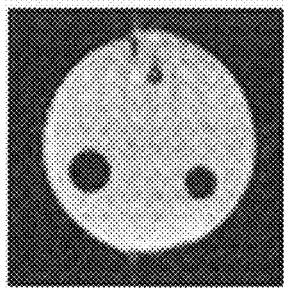
FIGS. 1(a)-1(c) illustrate images reconstructed using reference information acquired based on various variables in a conventional method.
Figure 1B:
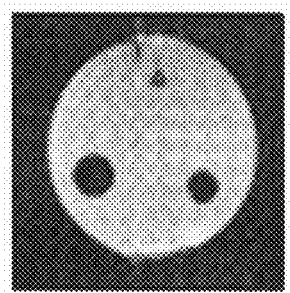
Figure 1C:
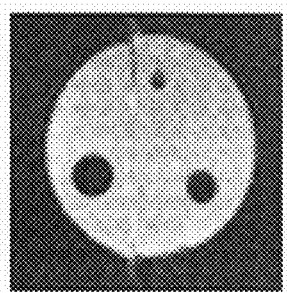
Figure 2A:
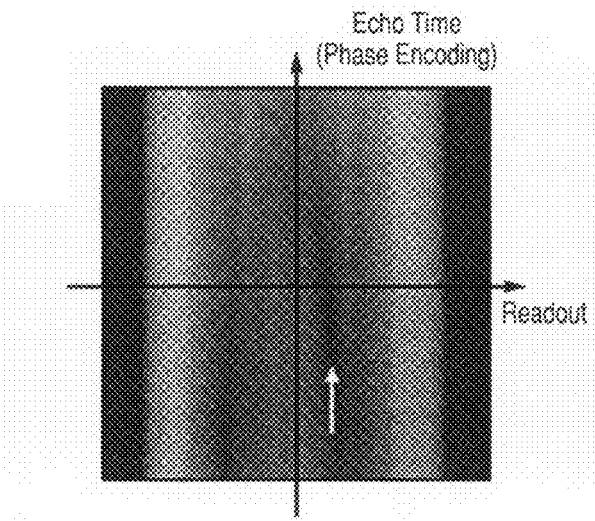
FIGS. 2(a)-2(d) illustrate projected images, which are obtained after one dimensional Fourier transformation of reference information for the case of defining different shimming values by a conventional method, and final images, which are reconstructed using the projected images.
Figure 2B:
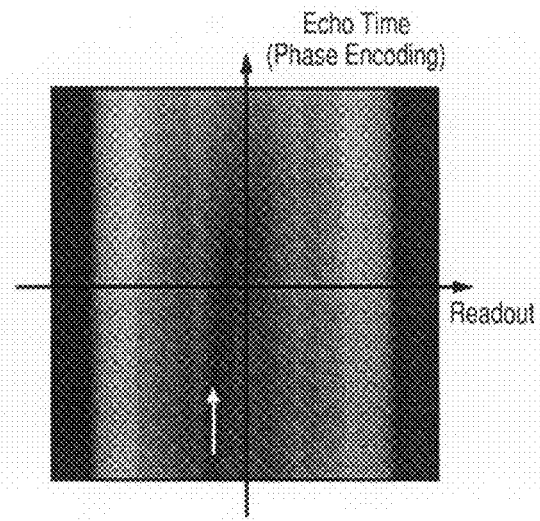
Figure 2C:
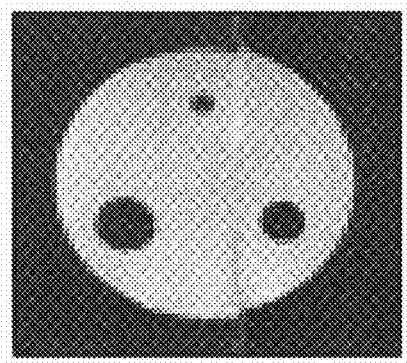
Figure 2D:
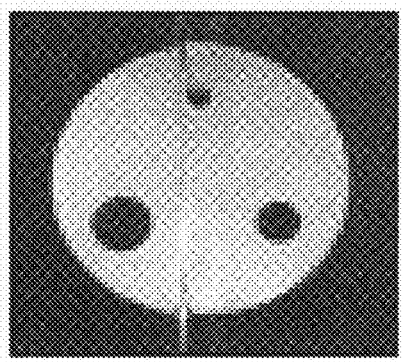

FIGS. 1(a)-1(c) illustrate images reconstructed using reference information acquired based on various variables in a conventional method.

A variable for acquiring gradient echo reference information was variously changed to find out whether the streak artifact mentioned in the above paper was caused by SNR. An experiment for this discovery was carried out using two average variables (e.g., number of excitation, which will be abbreviated as Nex. hereinafter, where Nex.=1 and 32) and two different flip angles (e.g., about 9 degrees and 90 degrees). FIGS. 1(a)-1(c) illustrate images obtained utilizing the aforementioned variables.

FIG. 1 (a) and FIG. 1 (b) illustrate phase-corrected images obtained by applying a non-linear correction method to the Nex.s of 1 and 32. At this time, the flip angle was about 90 degrees. FIG. 1 (c) illustrates a phase-corrected image obtained by applying the non-linear correction method under a condition that the Nex. was 1 and the flip angle was about 9 degrees. As illustrated in FIGS. 2(a)-2(d), even though an average signal value was increased by changing the average variable, or the flip angle was increased, streak artifacts were not corrected.

FIGS. 2(a)-2(d) illustrate projected images obtained after one-dimensional Fourier transformation of reference information when different shimming values were defined by a conventional method, and final images reconstructed using the projected images.

In particular, this illustration is to find out the correlation between the streak artifact and the shimming value. FIGS. 2 (a) and (b) illustrate projected images obtained by first acquiring gradient echo reference information using different shimming values and performing one-dimensional Fourier transformation thereto. The position where each of the projected images had a size of about 0 is marked with an arrow. Depending on the shimming value, the positions where the projected images had the size of about 0 were different from each other.

FIGS. 2 (c) and (d) illustrate images finally reconstructed and non-linearly phase-corrected using the two projected images. Depending on the shimming value, the two projected images had the size of about 0 at different positions substantially in the same sectional cut plane. Streak artifacts were produced in the final images whose phases were non-linearly corrected at different positions.

Based on the above results, streak artifacts were not caused by SNR of the reference information mentioned in the previous researches. Instead, the occurrence of streak artifact was usually observed in the following case. When the signal acquisition took place using the gradient echo reference information, if uniformity of a main magnetic field was unstable and magnetic susceptibility varied to a greater extent, Dephasing of the signal was likely to occur. As a result, the projected image had a size of about 0 after the one-dimensional Fourier transformation. When the size of the projected image became about 0, the streak artifact was likely to occur.

Also, there might be a severe error in phase because the non-linear phase correction was applied to main information using the phase at the position where the size of the projected image became about 0. Therefore, the occurrence of streak artifact can be eliminated when reference information that does not cause the signal Dephasing is acquired.

2) Correction Method Based on Embodiment

A non-linear phase correction method may be defined as mathematical equations 1 and 2 provided below.

Herein, $\tilde{S}_n^R(k_{RO})$ and $\tilde{S}_n^M(k_{RO})$ represent a magnetic resonance (MR) signal of additionally acquired reference information and a MR signal acquiring image information, respectively.

Also, $S_n^R(k_{RO})$ and $S_n^M(k_{RO})$ represent respective MR signals of reference information and image information when the MR signals have a uniform main magnetic field and are not affected by magnetic susceptibility. $P_n^R(x)$, $\tilde{P}_n^R(x)$, $P_n^M(x)$, and $\tilde{P}_n^M(x)$ represent signals after one-dimensional Fourier transformation of the aforementioned four MR signals, respectively. If projection information after the above one-dimensional Fourier transformation has a phase error, $\Phi(x)$, the reference information and the image information may be expressed as the following mathematical equations 1 and 2.

$$\tilde{S}_n^R(k_{RO}) \underline{1DFT} \tilde{P}_n^R(x) = P_n^R(x) \cdot e^{i\Phi_n^R(x)} \quad \text{[Mathematical Equation 1]}$$

$$\tilde{S}_n^M(k_{RO}) \underline{1DFT} \tilde{P}_n^M(x) = P_n^M(x) \cdot e^{i\Phi_n^M(x)} \quad \text{[Mathematical Equation 2]}$$

A non-linear phase function is used to perform the phase correction. The non-linear phase function is obtained by converting a phase part of the reference information into a negative value. The non-linear phase function may be defined as the following mathematical equation 3.

$$F_n^{NL}(x) = e^{-i\Phi_n^R(x)} \quad \text{[Mathematical Equation 3]}$$

A signal after the phase correction may be predicted as the following mathematical equation 4.

$$\hat{P}_n^M(x) = \tilde{P}_n^M(x) \cdot F_n^{NL}(x) = P_n^M(x) \cdot e^{i\Phi_n^M(x)} \cdot e^{-i\Phi_n^R(x)} = P_n^M(x) \cdot e^{i(\Phi_n^M(x) - \Phi_n^R(x))} \quad \text{[Mathematical Equation 4]}$$

The reference information acquisition method removes a phase-encoding gradient magnetic field from the image information acquisition method. Thus, a phase error between the reference information and the image information may be assumed to be substantially the same as the follows: $\Phi_n^R(x) = \Phi_n^M(x)$. Hence, since the information predicted by the mathematical equation 4 and the acquired information are substantially the same, the mathematical equation 5 may be defined as follows.

$$\hat{P}_n^M(x) = P_n^M(x) \quad \text{[Mathematical Equation 5]}$$

In the mathematical equation for the non-linear phase correction method, assuming that a constant is added with or subtracted from the phase of the image information, the phase of the reference information may be defined as the following mathematical equation 6.

$$\Phi_n^R(x) = \Phi_n^M(x) - \phi_0 \quad \text{[Mathematical Equation 6]}$$

To find the predicted information, substituting the mathematical equation 6 into the mathematical equation 4 provides the following equation.

$$\hat{P}_n^M(x) = P_n^M(x) e^{i\Phi_n^M(x)} e^{-i\Phi_n^R(x)} \quad \text{[Mathematical Equation 7]}$$

As seen from the mathematical equation 7, when the non-linear phase correction method is used, the addition and subtraction of the phase constant affects the application of the non-linear phase correction method but does not affect the finally reconstructed image.

On the basis of the correction characteristic of the phase constant, the elimination of streak artifact is theoretically proved.

Figure 3:
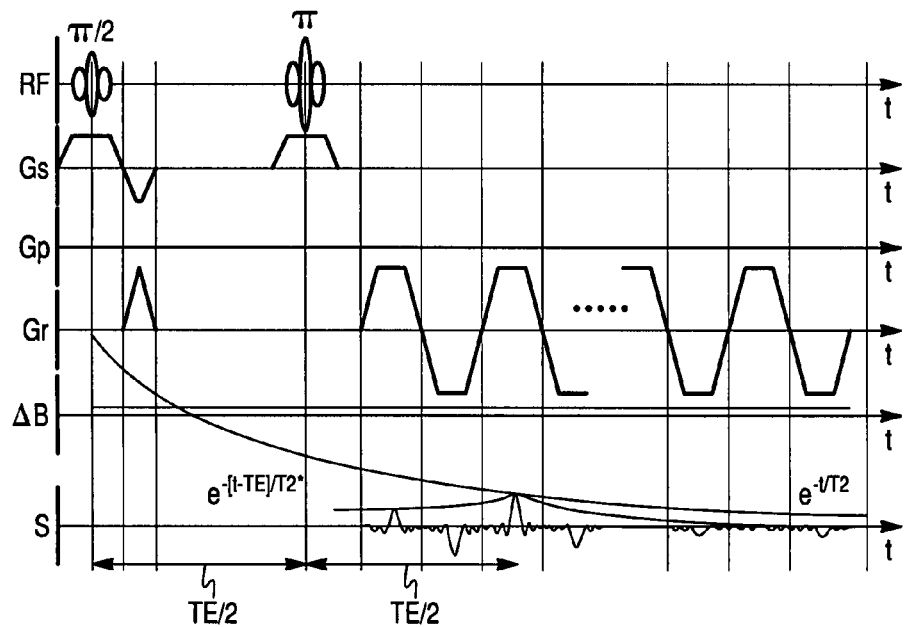
FIG. 3 illustrates acquisition of reference information by spin echo EPI according to an embodiment of the present invention.

FIG. 3 illustrates acquisition of reference information using spin echo EPI according to an embodiment of the present invention. The spin echo EPI for acquiring the reference information is suggested to replace the gradient echo EPI sensitive to uniformity in a main magnetic field and variation in magnetic susceptibility.

Figure 4:
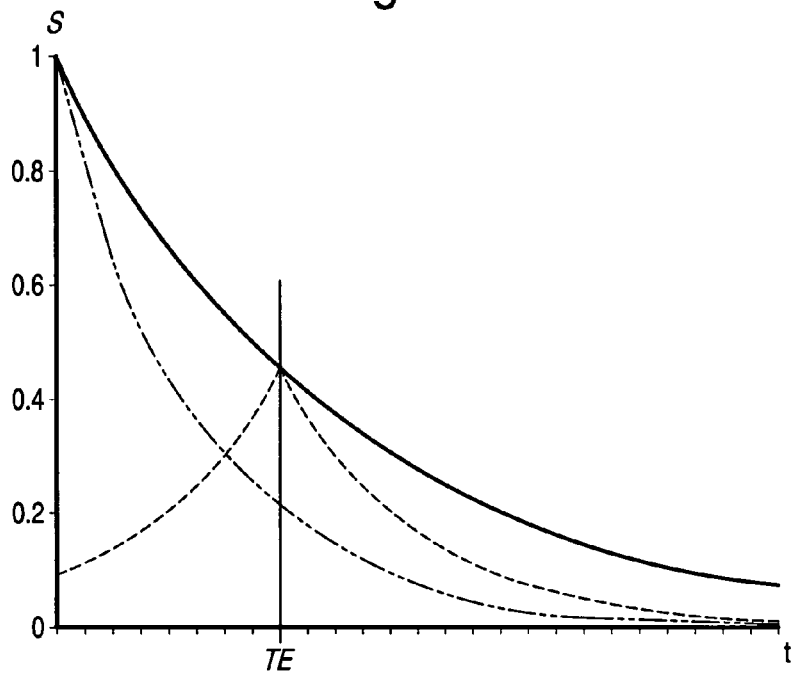
FIG. 4 is a graph depicting characteristics of a signal acquired by an imaging technique according to an embodiment of the present invention.
Figure 5A:
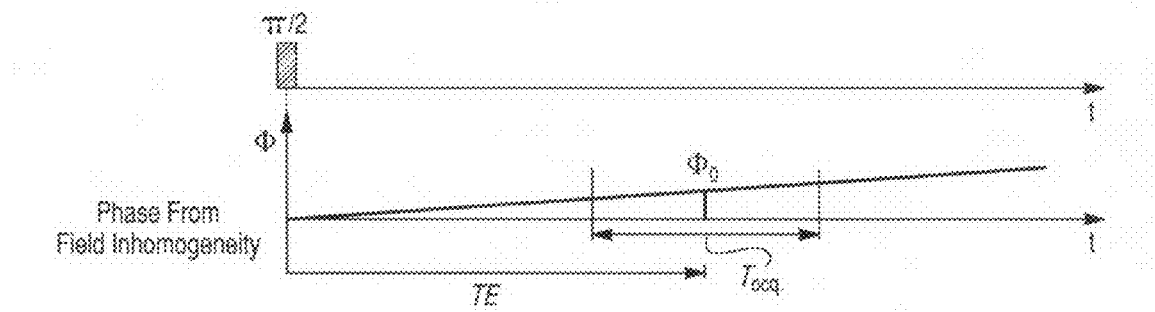
FIGS. 5(a)-5(f) illustrate comparison results between the case of using reference information acquired by gradient echo EPI and the case of using reference information acquired by spin echo EPI according to an embodiment of the present invention.
Figure 5B:
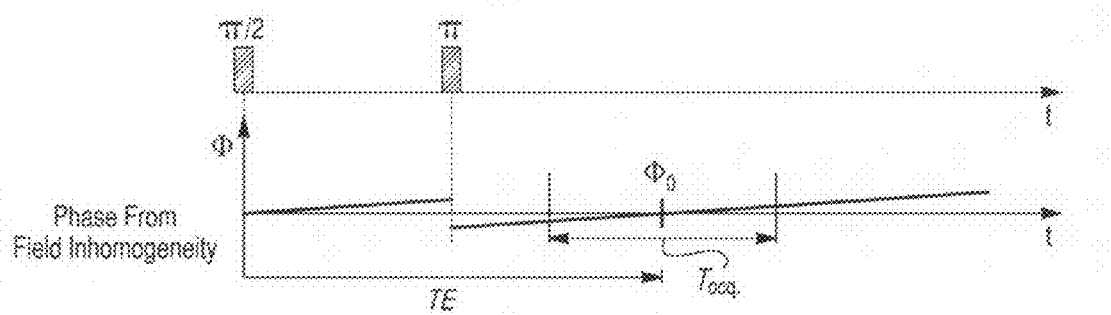
Figure 5C:
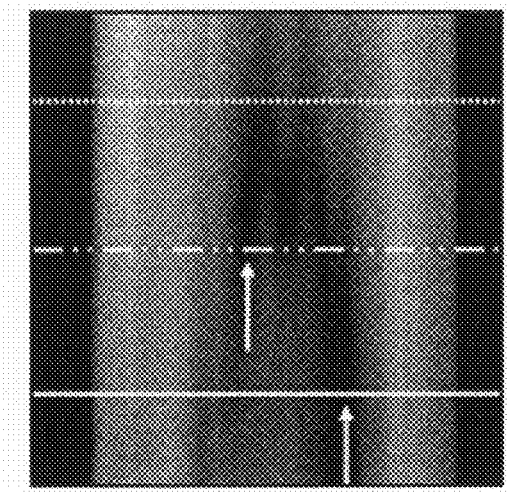
Figure 5D:
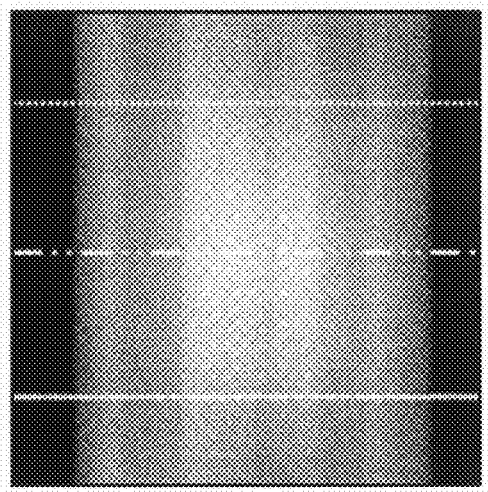
Figure 5E:
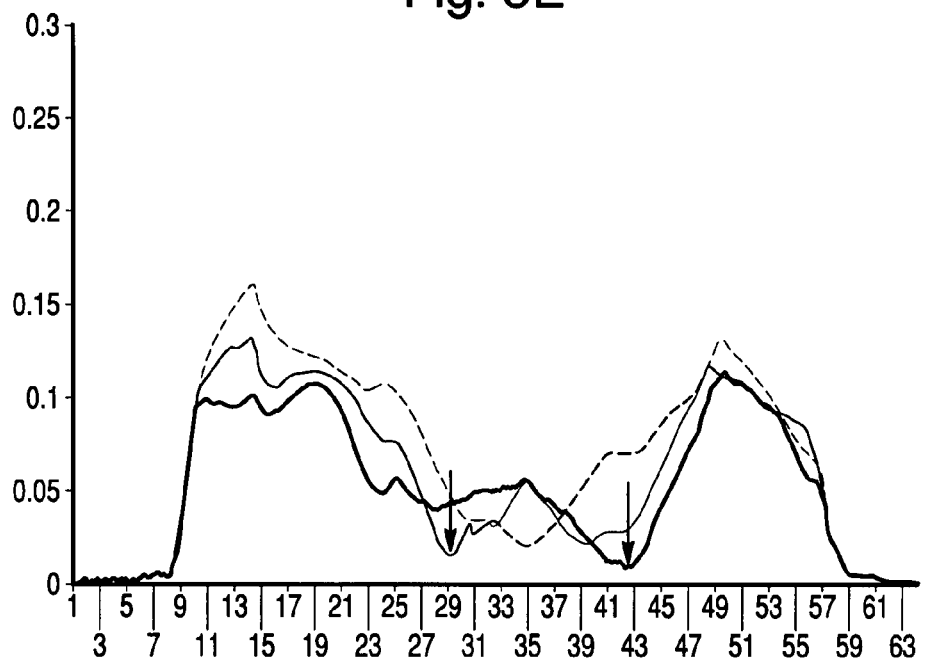
Figure 5F:
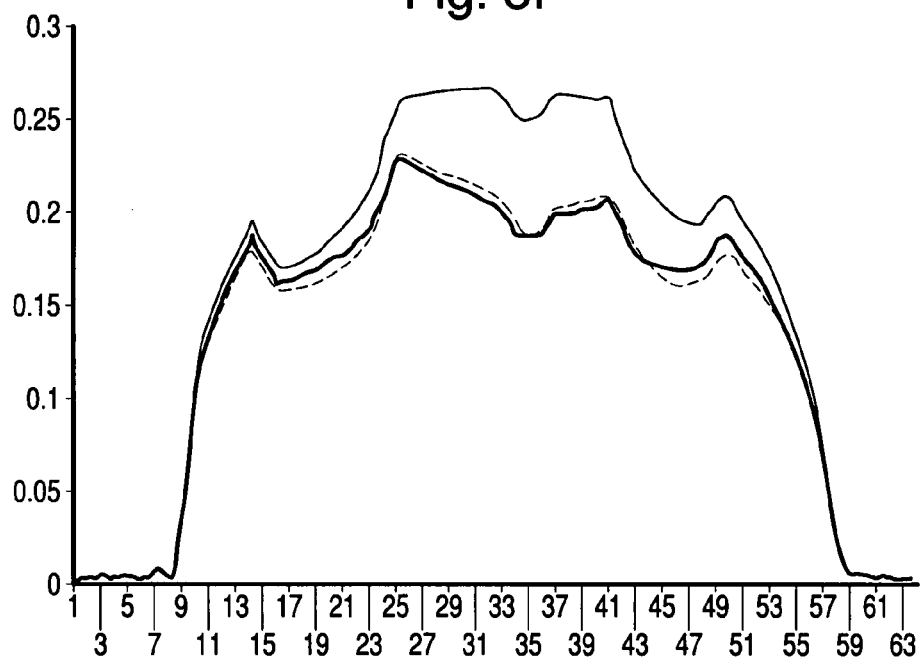

FIG. 4 is a graph depicting characteristics of a signal acquired by an imaging technique according to an embodiment of the present invention. As illustrated, for the same period of time, the magnitude of a signal acquired by the spin echo EPI is greater than that of a signal acquired by the gradient echo EPI. Thus, it is possible to acquire a stable signal with regardless of sensitivity to the uniformity in the main magnetic field and the variation in the magnetic susceptibility. In FIG. 4, a dotted line is a spin echo signal, while a double-dotted line is a gradient echo signal. Reference label TE represents echo time.

FIGS. 5(a)-5(f) illustrate comparison results between the case of using reference information acquired by the gradient echo EPI and the case of using reference information acquired by the spin echo EPI.

FIGS. 5 (a) and (b) show simplified phase distributions of two pieces of reference information, one acquired by the gradient echo EPI and the other acquired by the spin echo EPI. The difference in the illustrated phase distributions is that an offset constant exists. The offset does not affect an image reconstructed through the implementation of the phase correction method but affects the type of the phase correction method.

FIGS. 5 (c) and (d) represent magnitudes of the two pieces of reference information, acquired by the gradient echo EPI and the spin echo EPI, respectively, and subjected to one-dimensional Fourier transformation thereafter. The difference between the gradient echo EPI and the spin echo EPI is Dephasing of spins caused by the sensitivity associated with the uniformity of the main magnetic field and the variation in the magnetic susceptibility.

FIGS. 5 (e) and (f) illustrate three lengthwise sectional views substantially at the same position illustrated in FIGS. 5 (c) and (d). The magnitude of the reference information acquired by the gradient echo EPI becomes about 0 in certain regions. On the other hand, the magnitude of the reference information acquired by the spin echo EPI does not change in each position in view of the lengthwise sectional views.

Figure 6A:
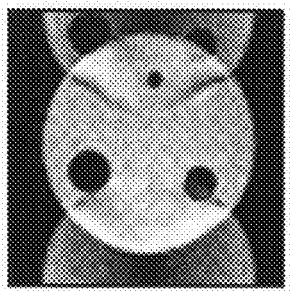
FIGS. 6(a)-6(c) illustrate comparative micrographs of an image reconstructed before the application of a non-linear phase correction method, an image reconstructed using reference information acquired by the gradient echo EPI, and an image reconstructed using reference information acquired by the spin echo EPI.
Figure 6B:
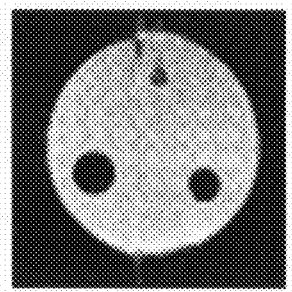
Figure 6C:
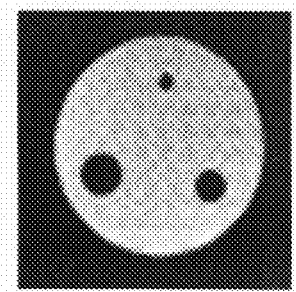

FIGS. 6(a)-6(c) illustrate comparative micrographs of an image reconstructed before the application of the non-linear phase correction method, an image reconstructed using reference information acquired by the gradient echo EPI, and an image reconstructed using reference information acquired by the spin echo EPI.

FIG. 6 (a) illustrates the image reconstructed without the phase correction. FIG. 6 (b) illustrates the image reconstructed with the non-linear phase correction using the gradient echo EPI reference information. FIG. 6 (c) illustrates the image reconstructed with the non-linear phase correction using the spin echo EPI reference information. When the non-linear phase correction method is applied according to the present embodiment, it is possible to acquire a stable image without a streak artifact, which is generally produced when the conventional non-linear phase correction method is applied.

The non-linear phase correction method according to the present embodiment comprises acquiring image information by gradient echo EPI, acquiring reference information by spin echo EPI, and correcting the gradient echo image information based on the spin echo reference information. Since the phase is corrected according to the spin echo reference information, a stable image corrected with a streak artifact can be acquired.

The image information is acquired under the state that a phase-encoding gradient magnetic field is applied. On the other hands, the reference information is acquired under that the state that the phase-encoding and the gradient magnetic field are not applied.

The phase value of the image information is the phase of the image information that is subjected to one-dimensional Fourier transformation. The phase value of the reference information is the phase of the reference information subjected to one-dimensional Fourier transformation and projected thereafter.

The correction may proceed with subtracting the phase value of the reference information from the phase value of the image information, and the subtraction may be implemented by converting the phase of the reference information into a negative value.

The above described non-linear correction method may be driven as a programmed computer readable recording medium.

Also, the non-linear phase correction method may be implemented in a MR apparatus to thereby acquire a MR image.

According to various embodiments of the present invention, stable images can be acquired by correcting various artifacts such as Nyquist ghost, geometric distortion and the like, and streak artifacts, which are usually produced in MR images.

In the exemplary embodiments of the present invention, a certain phase constant is added to prove the obviousness in using the spin echo EPI removed of the phase-encoding gradient magnetic field. In spite of the addition of the phase constant, it may be verified that the finally reconstructed image is not changed.

Therefore, the phase correction method based on the addition of a certain constant can be apparently applied to other imaging techniques using the non-linear phase correction method.

What is claimed is:

1. A method of obtaining a magnetic resonance image in which streak artifacts are corrected, the method performed by a magnetic resonance imaging apparatus, the method comprising:

acquiring magnetic resonance image information $\tilde{S}_n^M(k_{RO})$ by gradient echo planar imaging (EPI) under a state that a phase-encoding gradient magnetic field is applied;

acquiring reference information $\tilde{S}_n^R(k_{RO})$ by spin echo EPI under a state that the phase-encoding gradient magnetic field is not applied;

calculating a phase value of the reference information $e^{i\Phi_n^R(x)}$ by performing a one-dimensional Fourier transformation on the reference information;

calculating a non-linear phase function $e^{-i\Phi_n^R(x)}$ by converting the sign of the of phase value of the reference information;

calculating corrected image information in a Fourier domain $\hat{P}_n^M(x)$ by performing the one-dimensional Fourier transformation on the image information and multiplying the resulting Fourier transformed image information by the non-linear phase function of the reference information in the Fourier domain; and obtaining the streak corrected magnetic resonance image by performing a one-dimensional Fourier transformation on the corrected image information.

2. A computer readable recording medium having computer-executable instructions for performing a magnetic resonance imaging method comprising:

acquiring magnetic resonance image information $\tilde{S}_n^M(k_{RO})$ by gradient echo planar imaging (EPI) under a state that a phase-encoding gradient magnetic field is applied;

acquiring reference information $\tilde{S}_n^R(k_{RO})$ by spin echo EPI under a state that the phase-encoding gradient magnetic field is not applied;

calculating a phase value of the reference information $e^{i\Phi_n^R(x)}$ by performing a one-dimensional Fourier transformation on the reference information;

calculating a non-linear phase function $e^{-i\Phi_n^R(x)}$ by converting the sign of the of phase value of the reference information;

calculating corrected image information in a Fourier domain $\hat{P}_n^M(x)$ by performing the one-dimensional Fourier transformation on the image information and multiplying the resulting Fourier transformed on the image information by the non-linear phase function of the reference information in the Fourier domain; and obtaining the corrected magnetic resonance image by performing a one-dimensional Fourier transformation on the corrected image information.

3. A magnetic resonance imaging apparatus, comprising:

a processor programmed to:

acquire magnetic resonance image information $\tilde{S}_n^M(k_{RO})$ by gradient echo planar imaging (EPI) under a state that a phase-encoding gradient magnetic field is applied;

acquire reference information $\tilde{S}_n^R(k_{RO})$ by spin echo EPI under a state that the phase-encoding gradient magnetic field is not applied;

calculate a phase value of the reference information $e^{i\Phi_n^R(x)}$ by performing a one-dimensional Fourier transformation on the reference information;

calculate a non-linear phase function $e^{-i\Phi_n^R(x)}$ by converting the sign of the of phase value of the reference information;

calculate corrected image information in a Fourier domain $\hat{P}_n^M(x)$ by performing the one-dimensional Fourier transformation on the image information and multiply the resulting Fourier transformed image information by the non-linear phase function of the reference information in the Fourier domain; and obtain the corrected magnetic resonance image by performing a one-dimensional Fourier transformation on the corrected image information.

* * * * *